United States Patent
Damberg et al.

(10) Patent No.: US 6,885,106 B1
(45) Date of Patent: Apr. 26, 2005

(54) STACKED MICROELECTRONIC ASSEMBLIES AND METHODS OF MAKING SAME

(75) Inventors: Philip Damberg, Cupertino, CA (US); Craig S. Mitchell, San Jose, CA (US); John B. Riley, Dallas, TX (US); Michael Warner, San Jose, CA (US); Joseph Fjelstad, Maple Valley, WA (US)

(73) Assignee: Tessera, Inc., San Jose, CA (US)

( * ) Notice: Subject to any disclaimer, the term of this patent is extended or adjusted under 35 U.S.C. 154(b) by 11 days.

(21) Appl. No.: 10/044,121

(22) Filed: Jan. 11, 2002

Related U.S. Application Data

(60) Provisional application No. 60/261,059, filed on Jan. 11, 2001.

(51) Int. Cl.[7] .......................... H01L 23/48; H01R 12/00
(52) U.S. Cl. ................. 257/777; 257/685; 257/686; 257/697; 439/58; 439/67; 439/68
(58) Field of Search ................... 257/685, 686, 257/723, 777, 697; 439/58, 67, 68, 66

(56) References Cited

U.S. PATENT DOCUMENTS

| | | |
|---|---|---|
| 4,371,744 A | 2/1983 | Badet et al. |
| 4,371,912 A | 2/1983 | Guzik |
| 4,558,397 A | 12/1985 | Olsson |
| 4,734,825 A | 3/1988 | Peterson |
| 4,754,316 A | 6/1988 | Reid |
| 4,761,681 A | 8/1988 | Reid |
| 4,841,355 A | 6/1989 | Parks |
| 4,868,712 A | 9/1989 | Woodman |
| 4,941,033 A | 7/1990 | Kishida |
| 4,956,694 A | 9/1990 | Eide |
| 4,982,265 A | 1/1991 | Watanabe et al. |
| 4,994,902 A | 2/1991 | Okahashi et al. |
| 4,996,583 A | 2/1991 | Hatada |
| 4,996,587 A | 2/1991 | Hinrichsmeyer et al. |
| 5,028,986 A | 7/1991 | Sugano et al. |

(Continued)

FOREIGN PATENT DOCUMENTS

| | | |
|---|---|---|
| JP | 52-075981 | 6/1977 |
| JP | 56-61151 | 5/1981 |
| JP | 57-31166 A1 | 2/1982 |
| JP | 58-178529 | 10/1983 |
| JP | 60-194548 | 3/1984 |

(Continued)

OTHER PUBLICATIONS

"Megabyte Per Cubic Inch," Defense Science, May 1988, p. 56.

(Continued)

*Primary Examiner*—Jasmine Clark
(74) *Attorney, Agent, or Firm*—Lerner, David, Littenberg, Krumholz & Mentlik, LLP

(57) ABSTRACT

A stacked microelectronic assembly includes a dielectric element and a first and second microelectronic element stacked one atop the other with the first microelectronic element disposed between the second microelectronic element and the dielectric. The dielectric element has opposed first and second surfaces with conductive features exposed at the first surface and terminals exposed on the second surface. Preferably, the contact-bearing face of the first microelectronic element confronts the first surface of the dielectric with at least some of the conductive features being movable with respect to the contacts or terminals. By providing such movable features, joining units have heights of about 300 microns or less may be joined to the terminals thereby reducing the overall height of the microelectronic assembly to 1.2 mm and less.

60 Claims, 11 Drawing Sheets

U.S. PATENT DOCUMENTS

| | | |
|---|---|---|
| 5,045,921 A | 9/1991 | Lin et al. |
| 5,117,282 A | 5/1992 | Salatino |
| 5,128,831 A | 7/1992 | Fox, III et al. |
| 5,138,438 A | 8/1992 | Masayuki et al. |
| 5,148,265 A | 9/1992 | Khandros et al. |
| 5,148,266 A | 9/1992 | Khandros et al. |
| 5,152,695 A * | 10/1992 | Grabbe et al. ............... 439/71 |
| 5,172,303 A | 12/1992 | Bernardoni et al. |
| 5,173,055 A * | 12/1992 | Grabbe ....................... 439/66 |
| 5,198,888 A | 3/1993 | Sugano et al. |
| 5,222,014 A | 6/1993 | Lin |
| 5,239,198 A | 8/1993 | Lin et al. |
| 5,247,423 A | 9/1993 | Lin et al. |
| 5,252,857 A | 10/1993 | Kane et al. |
| 5,266,912 A | 11/1993 | Kledzik |
| 5,281,852 A | 1/1994 | Normington |
| 5,309,324 A * | 5/1994 | Herandez et al. .......... 361/734 |
| 5,311,401 A | 5/1994 | Gates, Jr. et al. |
| 5,313,096 A | 5/1994 | Eide |
| 5,334,875 A | 8/1994 | Sugano et al. |
| 5,347,159 A | 9/1994 | Khandros et al. |
| 5,376,825 A | 12/1994 | Tukamoto et al. |
| 5,384,689 A | 1/1995 | Shen |
| 5,397,916 A | 3/1995 | Normington |
| 5,412,247 A | 5/1995 | Martin |
| 5,455,740 A | 10/1995 | Burns |
| 5,518,964 A | 5/1996 | Distefano et al. |
| 5,552,631 A | 9/1996 | McCormick |
| 5,552,963 A | 9/1996 | Burns |
| 5,585,675 A * | 12/1996 | Knopf ....................... 257/774 |
| 5,600,541 A | 2/1997 | Bone et al. |
| 5,608,265 A | 3/1997 | Kitano et al. |
| 5,616,958 A | 4/1997 | Laine et al. |
| 5,625,221 A | 4/1997 | Kim et al. |
| 5,637,536 A | 6/1997 | Val |
| 5,656,856 A | 8/1997 | Kweon |
| 5,659,952 A | 8/1997 | Kovac et al. |
| 5,679,977 A | 10/1997 | Khandros et al. |
| 5,701,031 A | 12/1997 | Oguchi et al. |
| 5,708,298 A | 1/1998 | Masayuki et al. |
| 5,734,555 A | 3/1998 | McMahon |
| 5,751,063 A | 5/1998 | Baba |
| 5,764,486 A * | 6/1998 | Pendse ....................... 361/774 |
| 5,783,870 A | 7/1998 | Mostafazadeh et al. |
| 5,784,264 A | 7/1998 | Tanioka |
| 5,787,581 A | 8/1998 | Distefano et al. |
| 5,801,072 A | 9/1998 | Barber |
| 5,801,439 A | 9/1998 | Fujisawa et al. |
| 5,804,874 A | 9/1998 | An et al. |
| 5,810,607 A * | 9/1998 | Shih et al. ................. 439/66 |
| 5,829,988 A * | 11/1998 | McMillan et al. ........... 439/70 |
| 5,834,339 A | 11/1998 | Distefano et al. |
| 5,835,988 A | 11/1998 | Ishii |
| 5,859,472 A | 1/1999 | Distefano et al. |
| 5,861,666 A | 1/1999 | Bellaar |
| 5,883,426 A | 3/1999 | Tokuno et al. |
| 5,910,685 A | 6/1999 | Watanabe et al. |
| 5,915,752 A | 6/1999 | Distefano et al. |
| 5,976,913 A | 11/1999 | Distefano |
| 5,977,618 A | 11/1999 | Distefano et al. |
| 6,016,254 A * | 1/2000 | Pfaff ......................... 361/769 |
| 6,062,879 A * | 5/2000 | Beaman et al. .............. 439/91 |
| 6,093,029 A | 7/2000 | Kwon et al. |
| 6,121,676 A | 9/2000 | Solberg |
| 6,157,080 A * | 12/2000 | Tamaki et al. .............. 257/738 |
| 6,174,172 B1 * | 1/2001 | Kazama ...................... 439/66 |
| 6,180,881 B1 | 1/2001 | Isaak |
| 6,191,368 B1 | 2/2001 | Distefano et al. |
| 6,194,291 B1 * | 2/2001 | DiStefano et al. .......... 438/455 |
| 6,195,268 B1 | 2/2001 | Eide |
| 6,218,848 B1 | 4/2001 | Hembree et al. |
| 6,225,688 B1 | 5/2001 | Kim et al. |
| 6,228,686 B1 | 5/2001 | Smith et al. |
| 6,232,152 B1 | 5/2001 | Distefano et al. |
| 6,239,496 B1 | 5/2001 | Asada |
| 6,255,727 B1 * | 7/2001 | Khoury ....................... 257/693 |
| 6,268,649 B1 | 7/2001 | Corisis et al. |
| 6,274,823 B1 * | 8/2001 | Khandros et al. .......... 174/261 |
| 6,291,259 B1 | 9/2001 | Chun |
| 6,303,997 B1 | 10/2001 | Lee |
| 6,313,522 B1 | 11/2001 | Akram et al. |
| 6,329,607 B1 | 12/2001 | Fjelstad et al. |
| 6,335,565 B1 | 1/2002 | Miyamoto et al. |
| 6,369,445 B1 | 4/2002 | Khoury |
| 6,384,475 B1 * | 5/2002 | Beroz et al. ................. 257/690 |
| 6,407,456 B1 * | 6/2002 | Ball ........................... 257/777 |
| 6,462,421 B1 | 10/2002 | Hsu et al. |
| 6,476,474 B1 * | 11/2002 | Hung ......................... 257/686 |
| 6,499,216 B1 * | 12/2002 | Fjelstad ....................... 29/842 |
| 6,561,819 B1 * | 5/2003 | Huang et al. ................. 439/66 |
| 6,573,609 B1 * | 6/2003 | Fjelstad et al. ............. 257/778 |
| 6,657,286 B1 * | 12/2003 | Light ......................... 257/666 |
| 6,736,665 B1 * | 5/2004 | Zhou et al. ................. 439/482 |

FOREIGN PATENT DOCUMENTS

| | | | |
|---|---|---|---|
| JP | 61-029140 | 2/1986 | |
| JP | 61-101067 | 5/1986 | |
| JP | 61-120454 | 6/1986 | |
| JP | 61-137335 | 6/1986 | |
| JP | 61-255046 | 11/1986 | |
| JP | 63-18654 | 1/1988 | |
| JP | 64-71162 | 3/1989 | |
| JP | 5-144971 | * 6/1993 | ............. 257/700 |
| JP | 5-166994 | * 7/1993 | ............. 257/696 |

OTHER PUBLICATIONS

"Three–Dimensional Packaging," Defense Science, May 1988, p. 65.

U.S. Appl. No. 07/552,578, filed Jul. 13, 1990, Forthun.

U.S. Appl. No. PCT/US02/26805, filed Aug. 22, 2002, Mohammed.

U.S. Appl. No. 60/314,042, filed Aug. 22, 2001, Newsam.

U.S. Appl. No. 10/656,534, filed Sep. 5, 2003, Bang.

U.S. Appl. No. 09/776,356, filed Feb. 2, 2001.

* cited by examiner

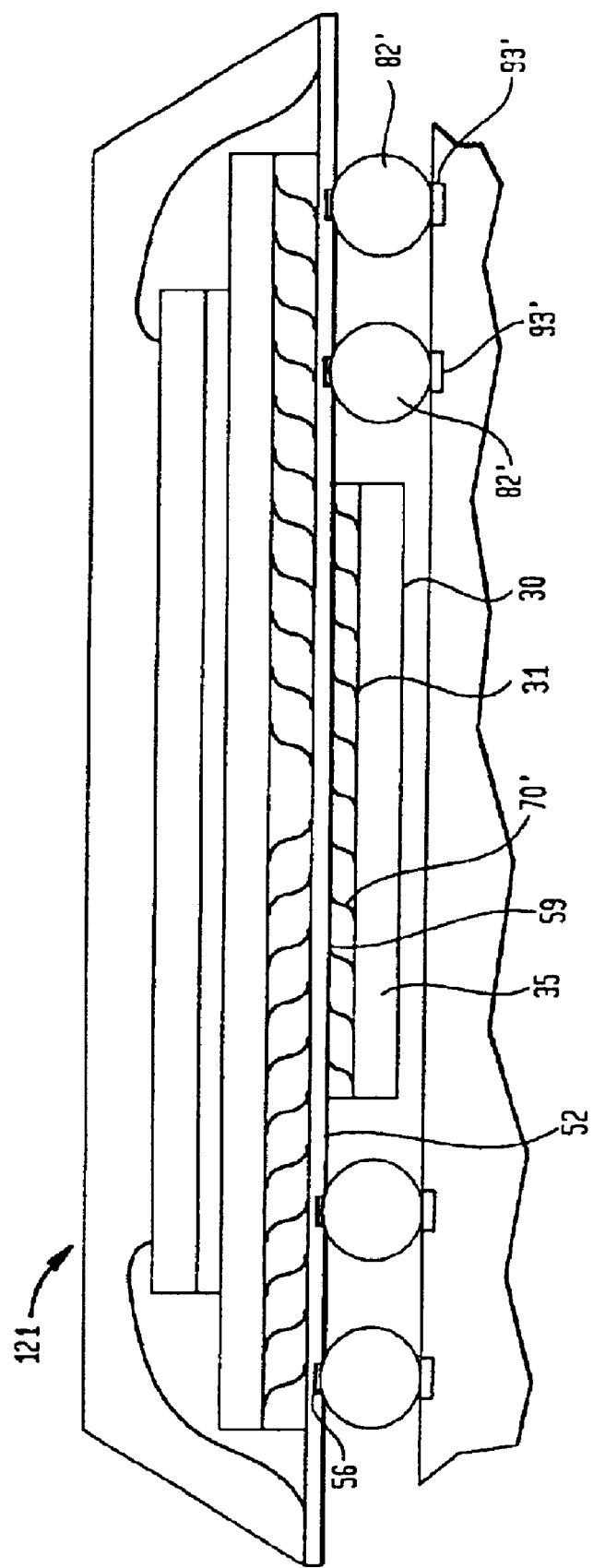

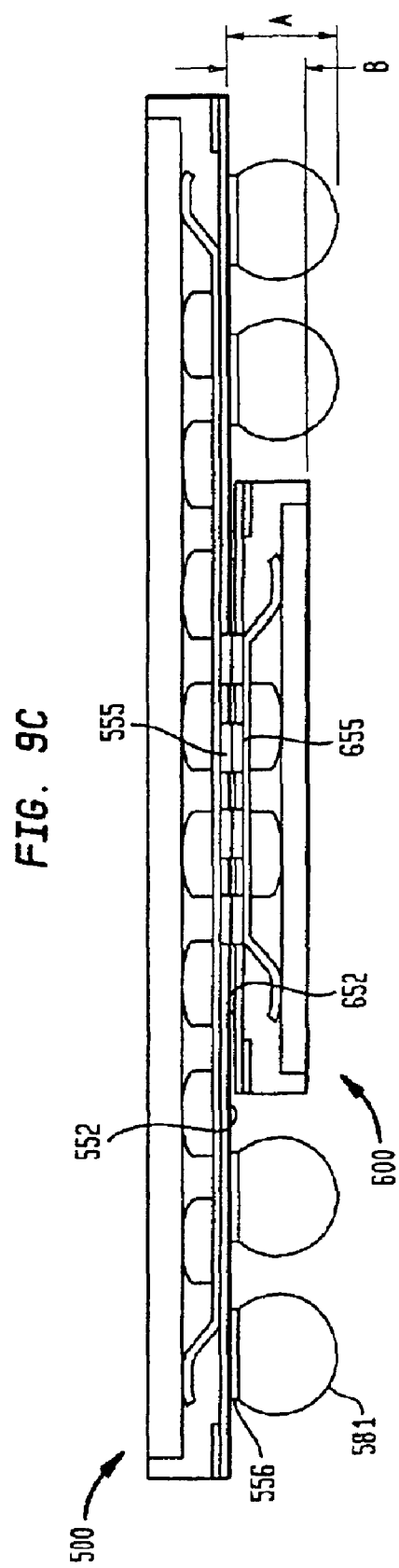

STACKED MICROELECTRONIC ASSEMBLIES AND METHODS OF MAKING SAME

CROSS-REFERENCE TO RELATED APPLICATIONS

The present application claims benefit of U.S. Provisional Patent Application No. 60/261,059 filed Jan. 11, 2001, the disclosure of which is incorporated by reference herein.

BACKGROUND OF THE INVENTION

The present invention relates to stacked microelectronic assemblies and methods of making such assemblies, to methods of forming such assemblies and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package, which in turn is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of the circuit panel and the contacts on the chip are bonded directly to the circuit panel by solder balls or other connecting elements. The "flip chip" design provides a relatively compact planar arrangement; each chip occupies an area of the circuit panel equal to or slightly larger than the area of the chip front face. However, this approach suffers from cost and reliability problems. As disclosed, for example, in certain embodiments of commonly assigned U.S. Pat. Nos. 5,148,265 5,148,266, and 5,679,977 the disclosures of which are incorporated herein by reference certain innovative mounting techniques offer compactness approaching or equal to that of conventional flip chip bonding without the reliability and testing problems commonly encountered in that approach. A Package which can accommodate a single chip in an area of the circuit panel equal to or slightly larger than the area of the chip itself are commonly referred to as "chip size packages".

Besides minimizing the planar area of the circuit panel occupied by a microelectronic assembly, it is also desirable to produce a chip package that presents a low overall height or dimension perpendicular to the plane of the circuit panel. Such thin microelectronic packages allow for placement of a circuit panel having the packages mounted thereon in close proximity to neighboring structures, thus reducing the overall size of the product incorporating the circuit panel.

Various proposals have been advanced for providing plural chips in a single package or module. In a conventional "multi-chip module", the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module. It has also been proposed to package plural chips in a "stacked" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned '977 and '265 patents and in U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Another approach is presented in commonly assigned U.S. Pat. Nos. 6,121,676; 6,225,688; and U.S. patent application Ser. No. 09/776,356 filed Feb. 2, 2001, the disclosures of which are incorporated herein by reference. The stacked microelectronic assemblies disclosed certain preferred embodiments of these patents and application include a flexible substrate having a plurality of attachment sites and conductive elements and a plurality of chips connected thereto. The flexible substrate is folded so as to stack the chips in substantially vertical alignment with one another. The resulting stacked assemblies typically have at least one layer of flexible substrate for every one or two chips in the stack which adds to the overall thickness of the assembly.

Certain preferred embodiments of U.S. Pat. No. 5,861,666, the disclosure of which is incorporated herein by reference, disclose an assembly of plural chip-bearing units vertically stacked one atop the other. Each unit includes a small panel or "interposer" and a semiconductor chip mounted thereto. The assembly also includes compliant layers disposed between the chips and the interposers so as to permit relative movement of the chips and interposers to compensate for thermal expansion and contraction of the components. The units are stacked so that the chips overlie one another, and are electrically interconnected with one another as, for example, by solder balls connecting conductive features of adjacent interposers to one another. The presence of an interposer in each unit contributes to the thickness of the stack.

Still further improvements in stacked chip assemblies would be desirable. Stacked chip assemblies should deal effectively with the problems associated with heat generation in stacked chips. Chips dissipate electrical power as heat during operation. Where chips are stacked one atop the other, it is difficult to dissipate the heat generated by the chips in the middle of the stack. Also, chips and circuit panels undergo substantial thermal expansion and contraction during operation. Differences in thermal expansion and contraction can impose significant mechanical strain on elements of the assembly, including the electrical connections. Moreover, the assembly should be simple, reliable and easily fabricated in a cost-effective manner.

SUMMARY OF THE INVENTION

One aspect of the present invention provides stacked microelectronic assemblies having a low overall height. In preferred embodiments, according to this aspect of the invention, first and second microelectronic elements are provided, one stacked on top of the other, the first microelectronic element overlies a dielectric element. The microelectronic elements may be semiconductor chips or other elements. One or both of the microelectronic elements are electrically connected to terminals on the dielectric element. The preferred assemblies have an overall thickness above the terminals of less than 1.2 mm. Preferably, joining units as, for example, solder balls, having a height of about 300 microns or less, more preferably 150 microns or less, are bonded to at least some of the terminals. The terminals on the dielectric element most preferably are movable relative to the first microelectronic element. In certain, more preferred embodiments, at least some of the terminals are disposed on a region of the dielectric element beneath the first microelectronic element. In the preferred assemblies according to this aspect of the invention, the various elements cooperate to provide an stacked chip assembly with both low height and high reliability. Because the terminals are movable relative to the bottom chip in the stack, the joining units will be subjected to relatively little deformation during manufacture and use. This facilitates the use of relatively low-height joining units such as small solder balls while maintaining acceptable stresses in the joining units or solder balls and hence maintaining acceptable reliability in the finished product. The low height of the assembly above the terminals coacts with the low height of the joining unit to provide an assembly with low overall height.

A stacked assembly according to a further aspect of the invention provide includes a dielectric element having oppositely-facing first and second surfaces and a plurality of electrically conductive terminals exposed on the second surface. First and second microelectronic elements are provided, each with a respective face surface, back surface and plurality of contacts exposed on the face surface. The microelectronic elements are positioned in a back-to-back configuration, preferably with the first microelectronic element disposed between the second element and the first surface of the dielectric element. In this arrangement, the first microelectronic element is disposed in face-down orientation, with its face surface facing toward the dielectric element, whereas the second microelectronic element is disposed in face-up orientation, with its face surface facing upwardly, away from the dielectric element.

At least some of the contacts of the first and second microelectronic elements are electrically connected to the terminals of the dielectric element through first and second elongated leads, respectively. At least some of the terminals are movable with respect to the contacts of the first microelectronic element. Some preferred embodiments according to this aspect of the invention use employ wire bonds as first leads and as second leads. Particularly preferred structures according to this aspect of the invention can provide the required connections in a stacked structure using a dielectric element which incorporates all of the terminals and traces required to connect the terminals with the leads in a single layer of metallic features. Thus, the dielectric element with traces and terminals thereon can be provided as a "single metal tape", using low-cost fabrication techniques. Still other preferred embodiments employ bond ribbons as the first leads and wire bonds as the second leads. The bond ribbons may be formed integrally with conductive traces on the dielectric element. Here again, the most preferred structures can be fabricated using a single layer of metallic features to form the traces, terminals and bond ribbons.

A stacked assembly according to a further aspect of the invention includes a dielectric element having conductive features thereon including elongated traces with terminals connected thereto, bond ribbons formed integrally with at least some of the traces, and bond pads formed integrally with others of the traces. First and second microelectronic elements such as semiconductor chips are provided, with the contact-bearing face surface of the first microelectronic element confronting the dielectric element and the second microelectronic element overlying the back surface of the first microelectronic element. Wire bonds connect the contacts of the second microelectronic element to the bond pads, and the bond ribbons extend to the contacts of the first microelectronic element. Preferably, the first and second microelectronic elements are substantially identical to one another and have each has its contacts disposed in a regions adjacent to an edge of the microelectronic element. More preferably, the contact-bearing edge regions of the first and second microelectronic elements are remote from one another.

A microelectronic assembly according to a further aspect of the invention also includes first and second microelectronic elements such as semiconductor chips. Each microelectronic element has a face surface, a back surface and first and second edges extending between the face and back surfaces. The second microelectronic element overlies the first microelectronic element with the face surface of the second microelectronic element confronting a surface of the first microelectronic element. The microelectronic elements are staggered so that a first edge region of the second chip face surface adjacent the first edge of the second chip projects beyond first chip but the second edge of the second chip does not project beyond the first chip. For example, The two chips may be identical to one another, and the center of the second chip may be offset from the center of the first chip in a lateral direction, parallel to the plane of the face and back surfaces of the chips. The second chip has contacts within the projecting first edge region of its face surface. The first chip has contacts exposed on its face surface.

The assembly according to this aspect of the invention also includes a dielectric element having first and second surfaces, the first and second chips being disposed over said first surface of said dielectric element with the first chip between the dielectric element and the second chip. Electrically conductive features as, for example, traces and terminals, are provided on the dielectric element. Leads extend between at least some contacts of each chip and at least some of the conductive features on the dielectric element. The projecting edge region of the second chip face surface provides access to the second chip for connection of the leads.

In one preferred arrangement according to this aspect of the invention, the face surface of the second microelectronic element confronts the rear surface of the first chip, and both chips are disposed in face-down orientation. The contacts of the first chip may be disposed in a first edge region of the first chip front surface adjacent the first edge thereof, and the first edge of the first chip may be disposed adjacent the first edge of the second chip.

The edge regions of the first and second chips may project beyond a first edge of the dielectric element, and leads may extend around this edge of the dielectric element to conductive features of the dielectric element on the second surface. For example, where the conductive features on the dielectric element include bond pads exposed on the second surface of the dielectric element, wire bonds can extend around the first edge of the dielectric element.

Yet another aspect of the invention provides a stacked microelectronic assembly that includes a first subassembly, comprising a first microelectronic element and a first dielectric element, and a second subassembly, comprising a second microelectronic element and a second dielectric element. The first and second subassemblies are electrically interconnected with each other and arranged in a stacked arrangement relative to each other. The first dielectric element includes a plurality of terminals and first lands exposed on a surface that is opposite the surface that confronts the first microelectronic element. The second dielectric element has second lands exposed on a surface of the second dielectric element that is opposite the surface that confronts the second microelectronic element. The first and second subassemblies are arranged so that the respective land-bearing surfaces of the dielectric elements confront each other with the first lands overlying the second lands and being electrically connected thereto. Joining units connected to at least some of the terminals of the first subassembly project beyond the second subassembly. Preferably, the terminals of the first subassembly are disposed within a peripheral region of a dielectric element and the lands disposed within a central region, more preferably underlying the first microelectronic element. The lands of the first or second subassemblies are movable with respect to the respective microelectronic elements. As further explained below, preferred assemblies according to this aspect of the invention provide a relatively compact structure and also facilitate testing of the individual subassemblies prior to joining of the subassemblies.

BRIEF DESCRIPTION OF THE DRAWINGS

FIGS. 2A–2B are views similar to FIG. 1 but depicting other embodiments of the present invention.

FIG. 9C is a diagrammatic sectional elevational view of an assembly incorporating the subassemblies of FIGS. 9A and 9B.

DETAILED DESCRIPTION OF THE PREFERRED EMBODIMENTS

Figure 1A:
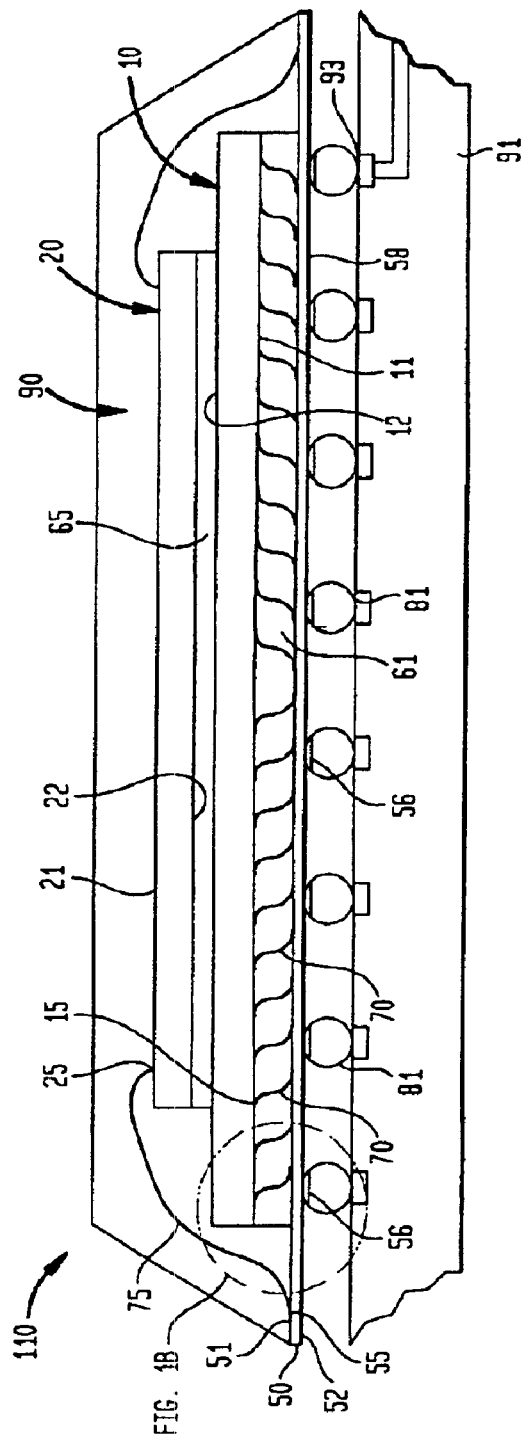
FIG. 1A is a diagrammatic sectional elevational view of a stacked assembly according to one embodiment of the present invention.

As shown in FIG. 1, a stacked microelectronic assembly 110 according to one embodiment of the present invention includes a first microelectronic element 10 and a second microelectronic element 20. Microelectronic element 10 has a face surface 11 and a back surface 12 opposite the face surface. Electrical contacts 15 are exposed on face surface 11. Microelectronic element 20 is arranged similarly to microelectronic element 10, in that it has face surface 21, a back surface 22 opposite the face surface and electrical contacts 25 are exposed on face surface 21. In the embodiment of FIG. 1, each microelectronic element 10 and 20 is a conventional semiconductor chip. The contacts 15 on the first microelectronic element are disposed in a "area array" or array of contacts at substantially equal distances over the area of face surface 11, whereas the contacts 25 are disposed in two rows adjacent opposite edges of such surface.

The assembly also includes a dielectric element 50 has a first surface 51 and a second surface 52 with electrically conductive terminals 56 exposed on the second surface. As used in this disclosure, a statement that a conductive feature such as a terminal, contact, bonding pad or the like is "exposed on" a surface of a structure means that it is accessible to be electrically connected with another conductive element which approaches the surface. The conductive feature may be flush with the specified surface, may project outwardly from such surface, or may be recessed relative to such surface. For example, as best seen in FIG. 1B, terminals 56 are recessed from the second surface 52 of the dielectric element, but are exposed on the second surface 52 through holes 57 in the dielectric element. Preferably, dielectric element 50 comprises a layer of flexible material (FIG. 1A), such as a layer of polyimide, BT resin or other dielectric material of the type commonly utilized for making tape automated bonding ("TAB") tapes. Dielectric element 50 also includes additional conductive features including bond pads 55 exposed on first surface 51, conductive traces 53 as well as leads 70 in the form of bond ribbons formed integrally with some of the traces. The dielectric element may further include a solder mask layer 58 (FIG. 1B) defining the first surface, with apertures or holes at bond pads 55. Traces connect the various conductive features to each other. Preferably, at least some of leads 70 are connected to at least some of the terminals 56, whereas at least some bond pads 55 are also connected to at least some of the terminals. Some or all of the bond pads may be connected with some or all of leads 70. Most preferably, all of the aforementioned conductive features on the dielectric element are formed from a single layer of metal. This avoids the need for precise registration between multiple layers of metallic features and formation of interconnections between such layers during manufacture of the dielectric element. Additional metallic features (not shown) such as conductive planes for use as ground planes or power distribution planes may be provide.

Microelectronic element 10 is disposed over first surface 51 in a downwardly-facing orientation with face surface 11 confronting upwardly-facing first surface 51. Second microelectronic element 20 overlies first element 10 with face surface 21 in an upwardly-facing direction. One result of this arrangement is that back surfaces 12 and 22 confront each other in a "back-to-back" configuration. With regard to the present disclosure, terms such as "downwardly" or "upwardly" are used to describe directions that are opposed to each other without regard to any gravitational frame of reference. Similarly, terms such as "over" and "under", or "above" and "below" are used to describe the relative positions of elements of an assembly within the frame of reference of the assembly itself.

It is preferred, although not necessary to the invention, that microelectronic elements 10 and 20 are attached to each other by means such as adhesive layer 65. Adhesive 65 may be a die attach adhesive, and may comprised of low elastic modulus material such as a silicone elastomer. However, where the two microelectronic elements are conventional semiconductor chips formed from the same material, they will tend to expand and contract in unison in response to temperature changes, and accordingly a relatively rigid attachment as, for example, a thin layer of a high-modulus adhesive or a solder can be employed.

Contacts 15 are electrically connected to the bond ribbon leads 70. The bond ribbons may be of the type described in U.S. Pat. No. 5,518,964, the disclosure of which is incorporated by reference herein. As disclosed in certain embodiments of the '964 patent, the bond ribbons may be initially formed in place on the first surface of the dielectric element, and may initially extend in the plane of such surface. The bond ribbons may be connected to the contacts 15 of the first microelectronic element, and may be deformed to the vertically-extensive disposition depicted in FIGS. 1A and 1B by moving the first microelectronic element 10 and the dielectric element away from one another after bonding the ribbons to the contacts of the first microelectronic element. Related bond ribbon configurations and methods of forming bond ribbons are discussed in U.S. Pat. Nos. 6,329,607; 6,228,686; 6,191,368; 5,976,913; and 5,859,472, the disclosures of which are also incorporated by reference herein.

Contacts 25 of the second microelectronic element 20 are electrically connected to bonding pads 55, and hence to terminals 56, by second leads 75 in the form of wire bonds. The wire bonds or second leads extend downwardly to the dielectric element and bonding pads past the edges of the first microelectronic element 10. The wire bonds may be formed by conventional wire bonding equipment and techniques. The wire bonding operation may be performed before the first microelectronic element 10 is moved away from the dielectric element 50. For example, the first and second microelectronic elements may be attached to one another in back-to-back disposition by die attach material as discussed above; then the contacts 15 of the first microelectronic element 10 may be connected to the bond ribbons; then the wire bonding operation may be performed and finally the attached microelectronic elements may be moved away from the dielectric element 50. During the wire bonding operation, the face surface 11 of the element 10 abuts the dielectric element, which in turn may abut a support fixture (not shown) so as to provide a firm support during the wire bonding operation.

Figure 1B:
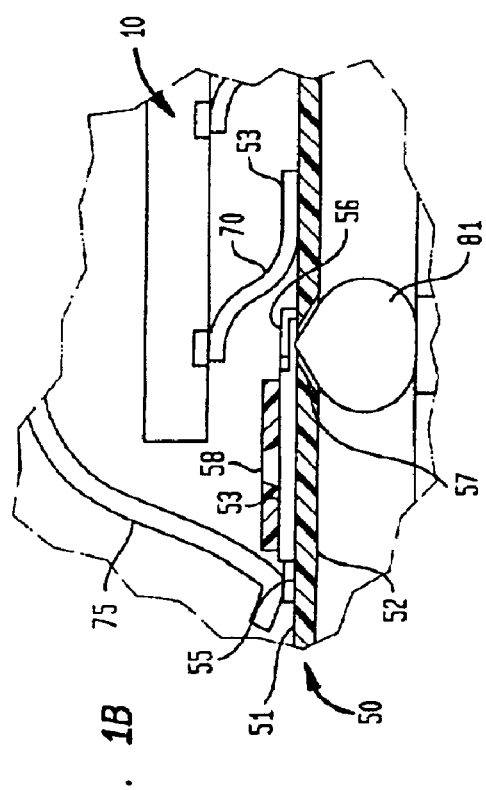
FIG. 1B is a fragmentary, diagrammatic sectional view on an enlarged scale depicting the area indicated at 1B in FIG. 1A.

As illustrated in FIG. 1A, at least some of the terminals 56 are disposed beneath face surface 11 of microelectronic element 10. At least some of the terminals 56 are moveable with respect to the first microelectronic element 10 and hence with respect to at least some of contacts 15.

In preferred embodiments, stacked assembly 110 also includes a spacer layer 61 disposed between face surface 11 of microelectronic element 10 and first surface 51 of dielectric element 51. As disclosed in the '964 patent, the spacer layer may be formed by injecting a curable material around the leads during or after movement of the microelectronic element 10 away from the dielectric element. Desirably, spacer layer 61 is made of a compliant material that allows movement of dielectric element 50, and hence movement of terminals 56, relative to contacts 15. Preferred materials for such compliant layers include epoxies and silicones, with flexibilized epoxies and silicone elastomers being particularly preferred. The leads 70 and 75 are flexible to permit such movement. Assembly 110 may include an encapsulant 90 that covers elongated leads 75 and protects the microelectronic elements. In embodiments that do not include a separate spacer layer 61, the encapsulant may also be provided between the face surface 11 and first surface 51, preferably surrounding leads 70, and may fill open spaces between microelectronic elements 10 and 20 Preferred encapsulants comprise flexibilized epoxies or silicone elastomers. Where the encapsulant is formed separately from the spacer layer, the encapsulant desirably has a modulus of elasticity that is greater than the modulus of elasticity of the spacer layer 61.

The stacked assembly may further include a plurality of joining units, such as eutectic solder balls 81. Solder balls 81 are attached to terminals 56, and hence are electrically interconnected to at least some of the bond pads 55, second leads 75 and second contacts 25, as well as to at least some of the first or ribbon leads 70 and first contacts 15. Other types of joining units such as solid-core solder balls, masses or balls of a diffusion-bonding or eutectic bonding alloy, masses of a conductive polymer composition, or the like may be employed.

In use, the assembly is mounted on a circuit panel such as a circuit board 91 having contact pads 93. The second surface 52 of the dielectric element faces downwardly toward the circuit board, and joining units 81 are bonded to the contact pads of the circuit board, thus connecting the contact pads to the microelectronic elements. The contact pads of the circuit board are connected by traces on or in the circuit board to the other elements of an electrical circuit which must coact with microelectronic elements 10 and 20. During the bonding operation, and during operation of the completed circuit board and circuit, differential thermal expansion and contraction of the circuit board and chips may occur. This may be caused by differences between the coefficients of expansion of the microelectronic elements and circuit board; by difference in temperature between the microelectronic elements and the circuit board; or by combinations of these factors. Such differential thermal expansion causes some or all of the contact pads 93 to move relative to the microelectronic elements and contacts 15 and 25.

Movement of terminals 56 relative to the microelectronic elements, and particularly relative to first microelectronic element 10, relieves some or all of the stress which would otherwise be imposed on joining units 81 by relative movement of the terminals and contact pads.

Preferred combinations of the features described above allow the manufacture of a two-chip stacked assembly having thickness of less than 1.2 mm above the terminals 56. More preferably, such a thickness will be 0.7 mm (700 microns) or less.

In preferred embodiments of the present invention, joining units or solder balls 81 have a height of about 300 microns or less; more preferably, about 200 microns or less, and most preferably about 150 microns or less. Thus, the overall height of the assembly above the circuit panel after assembly, including the height of the joining units, most preferably is about 1.5 mm or less, and most preferably about 1.3 mm or less. Joining units having such low heights, also known as "fine pitch" joining units, may be used to beneficial effect with assemblies wherein the terminals are moveable with respect to the microelectronic elements and relative to the contacts on the microelectronic elements. As discussed above, this movability, relieves the mechanical strain or deformation generated by differential thermal expansion of the microelectronic elements. Some of the deformation may also be relieved by flexure of the joining units connecting the assembly to a circuit panel, such as a printed circuit board. Larger joining units can flex to a greater extent than smaller ones and, therefore, relieve a greater amount of deformation without failure due to fatigue of the joining units. In preferred embodiments of the present invention, the movement the terminals relative to microelectronic elements relieves a significant portion of such deformation, allowing the use of relatively small joining units while still maintaining acceptable levels of reliability.

Figure 2A:
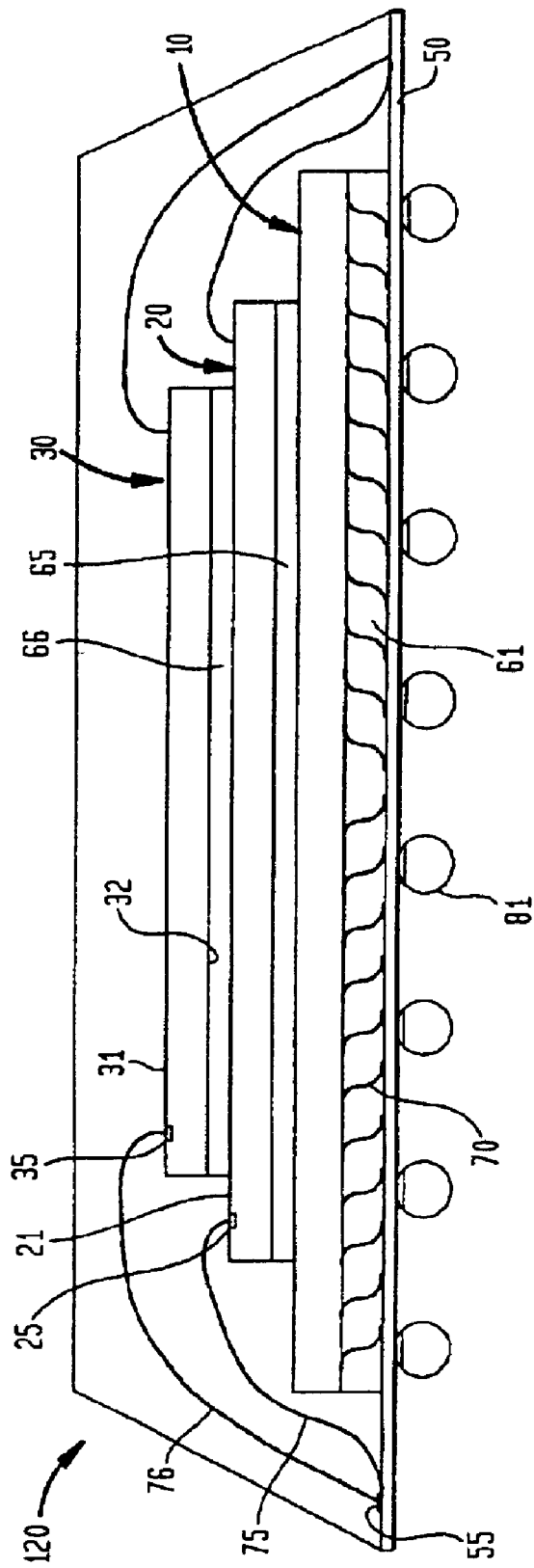

An assembly 120 according to a further embodiment of the invention, depicted in FIG. 2A, is generally similar to the assembly of FIGS. 1A–1B, but includes a a third microelectronic element 30. Element 30 is disposed over microelectronic element 20 with its contact-bearing face surface 31 facing in an upward direction, away from microelectronic element 20 and away from dielectric element 50. Third element 30 has at least one horizontal dimension smaller than the corresponding dimension of second element 20, so that contacts 25 of element 20 are exposed. Back surface 32 of third element 30 confronts face surface 21 of second element 20. Preferably, back surface 32 is attached to face surface 21 by an adhesive layer or other attachment as discussed above with reference to die attach layer 65. Contacts 35 are electrically connected to additional bond pads 55 by wire bonds 76.

The assembly 121 of FIG. 2B is also generally similar to the assembly of FIGS. 1A–1B, but has a third microelectronic element 30 mounted below the dielectric element 50. The contact-bearing or face surface 31 of third microelectronic element 30 confronts second surface 52 of dielectric element 50. Ribbon leads 70' connect contacts 35 to conductive features 59 exposed on second surface 52. These conductive features 59 may be traces formed integrally with ribbon leads 70, and may be connected with the other traces and conductive elements of the assembly, including terminals 56. Preferably, terminals 56' and joining units 82' mounted to such terminals are located in a peripheral region of second surface 52, whereas the third microelectronic element 30 and conductive features 59 are located in a central region thereof. Because element 30 is disposed on the same side of dielectric element 50 as the joining units, joining units 82 must be large enough to project beyond the third element to contact the contact pads 93' of the circuit board or other circuit panel. However, because the third microelectronic element is accommodated within the height occupied by the joining units, the overall height of the assembly still can be the same as or less than the height of an assembly having the third microelectronic element mounted atop the second microelectronic element.

Figure 3:
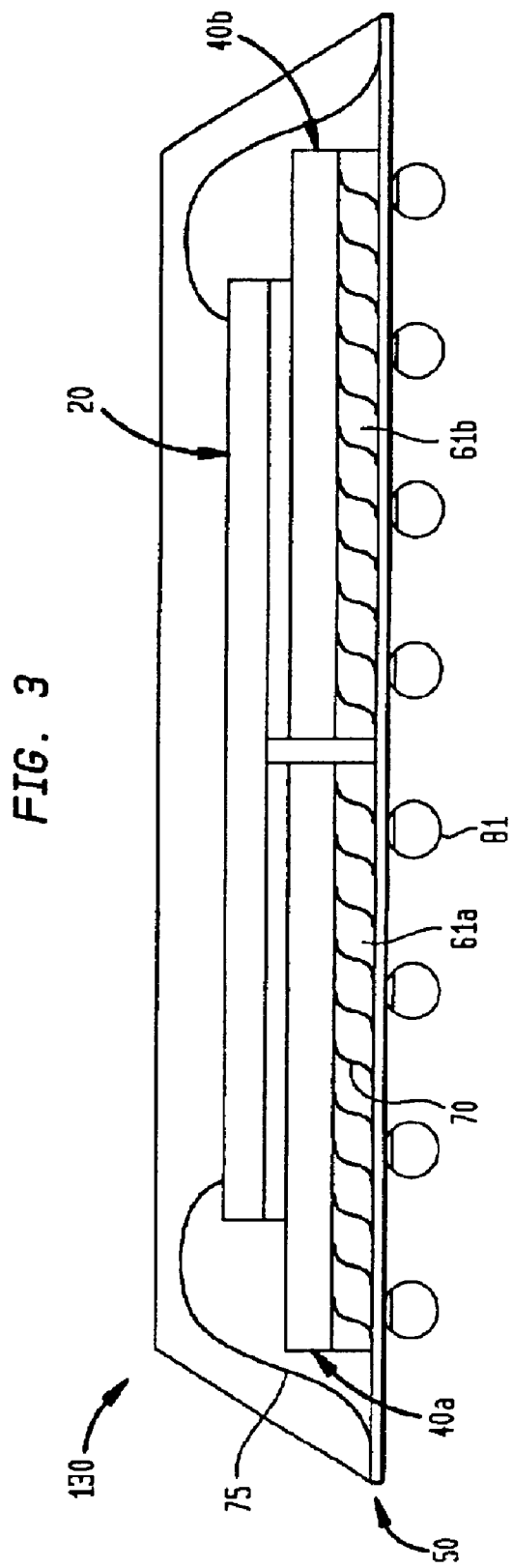
FIG. 3 is a view similar to FIG. 2 but depicting yet another embodiment of the present invention.

FIG. 3 illustrates another preferred embodiment 130 wherein the first microelectronic element includes two individual semiconductor chips or other individual components 40a,40b in place of the unitary chip 10 used in FIG. 1. Components 40a,40b are disposed adjacent to each other in a face-down configuration over dielectric element 50. Second microelectronic element 20 desirably is disposed over at least a portion of each component 40a,40b. In further variants, the first microelectronic element may include more than two components. Alternatively or additionally, the unitary second microelectronic element 20 can be replaced by an assemblage of two or more components disposed side-by-side.

Figure 4:
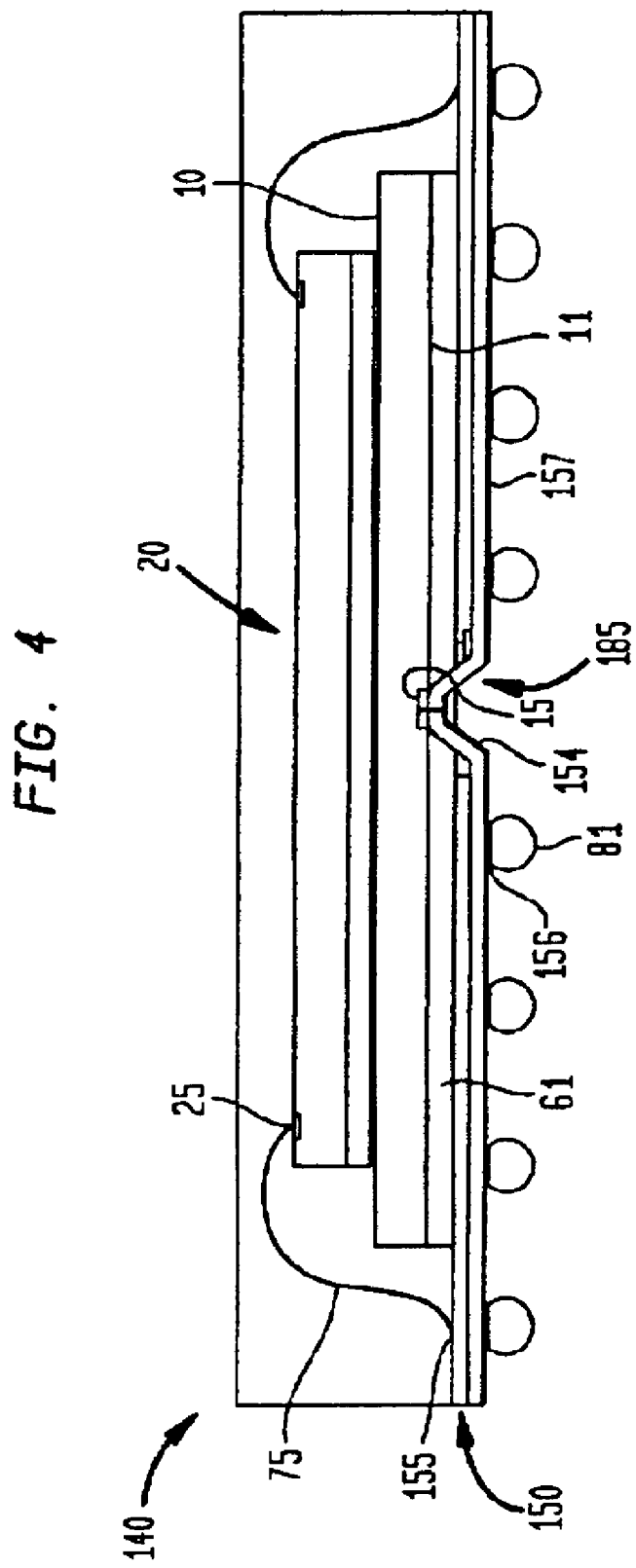
FIG. 4 is side view similar to FIG. 1 but depicting another embodiment of the present invention.

FIG. 4 illustrates a preferred stacked assembly 140, similar to the assemblies of FIGS. 1A and 1B, but having the contacts 15 of microelectronic element 10 disposed within a central region of face surface 11. For example, contacts 15 may be formed as one or two parallel rows adjacent the center % of face surface 11. These contacts electrically connected to dielectric element 150 by elongated ribbon leads 154 which are formed from metallized layer 157 of dielectric element 150. Here again, the ribbon leads desirably are formed integrally with traces or other conductive features on the dielectric element. Preferably, bond pads 155, and terminals terminals 156, as well as conductive traces used to provide interconnections between conductive features, are formed as parts of a single metallic layer 157.

Figure 5:
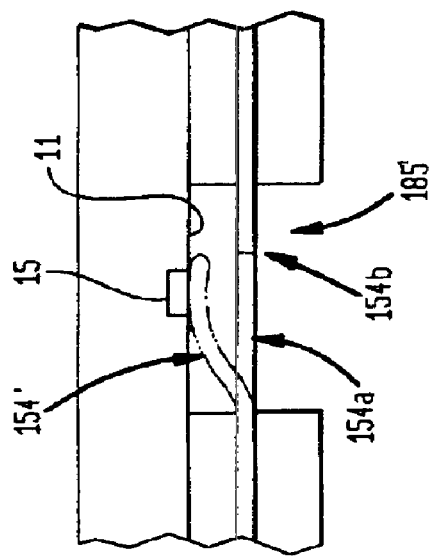
FIG. 5 is a fragmentary, diagrammatic view depicting steps of forming an electrical connection of a type illustrated in FIG. 4.

The dielectric element 150 includes an aperture or slot 185 which is aligned with the contacts 15. Ribbon leads 154 may be conventional leads of the type commonly used in tape automated bonding or "TAB" assemblies. As manufactured, the ribbon leads 154 project over the aperture or slot 185. During manufacture, the ribbon leads are engaged by a bonding tool such as a thermosonic or ultrasonic bonding tool, and forced into engagement with contacts 15. More preferably, ribbon leads 154 are formed in accordance with U.S. Pat. Nos. 5,787,581; 5,915,752 and 5,977,618, the disclosures of which are also incorporated by reference herein. As described in greater detail in certain embodiments of those patents, and as schematically shown in FIG. 5, the ribbon leads 154 as initially fabricated may include a bond section 154a that extends over slot or aperture 185. In a preferred method, bond section 154a may have a notch or other weakened portion therein to provide a fracture point 154b. A bonding tool is then inserted to break bond ribbon 154a and push the broken end to the position shown in broken lines at 154' making an electrical connection with contact 15 on face surface 11.

In the diagram of FIG. 4, the metallization layer 157 is depicted as lying on the second surface of dielectric element 150, i.e., the surface facing away from the microelectronic elements. In such a configuration, the dielectric element can incorporate apertures (not shown) at the bond pads 155 to expose the bond pads on the first surface of the dielectric element and facilitate connection of wire bonds 75. Alternatively or additionally, the metallization layer may be formed on the first surface of the dielectric element. Less preferably, conductive vias may extend through the dielectric element from traces on the second surface to bond pads on the first surface.

Figure 6:
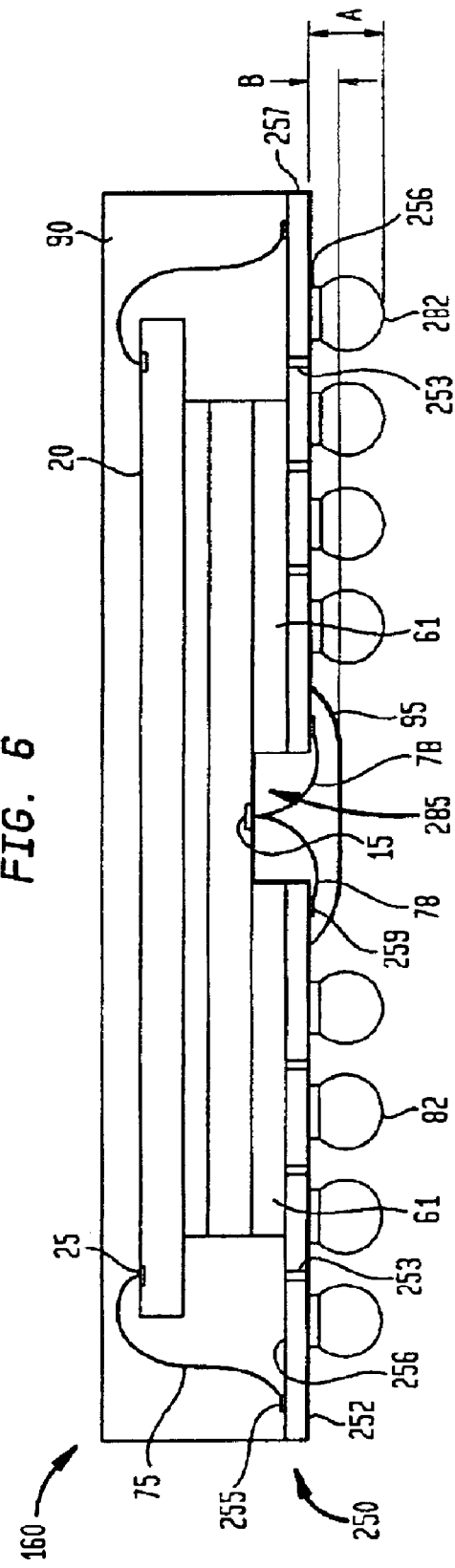
FIGS. 6, 7, and 8 are views similar to FIG. 1 but depicting further embodiments of the present invention.

In an assembly according to a further embodiment 160, illustrated in FIG. 6, contacts 15 are electrically connected to bond pads 259 exposed on the second surface 251 of dielectric element 250 by elongated first leads 78 in the form of wire bonds. Leads 78 extend through aperture 285 which penetrates the dielectric element 250 to expose contacts 15. As depicted, spacer layer 61 is single pad that is also penetrated by aperture 285, but two of separate pads disposed on opposite sides of aperture 285 may be used to provide open space in alignment with the aperture. Preferably, leads 78 are covered by encapsulant 95. More preferably, encapsulant 95 fills aperture 285. The material used for encapsulant 95 may be the same as that used for encapsulant 90 or else different materials may be used.

Because bond pads 259 are exposed at the second surface 252, on the opposite side of dielectric element 250 from microelectronic element 10, leads 78 also extend beyond second surface 252. Joining units 282 must extend beyond the leads and any additional thickness provided by encapsulant 95 to be effective in connecting assembly 160 to a printed circuit board or other substrate. That is, the height A of the joining units 282 is equal to or, preferably, greater than, the height B of the encapsulant, both as measured from second surface 252 of the dielectric layer.

Dielectric element 250 is illustrated as having two layers of metallization, also known as a two metal tape, with conductive features on first surface 251, such as bond pads 255, being formed separately from conductive features on second surface 252, such as terminals 256 and bond pads 259. The metallic layers are connected to each other by vias 253 or other electrically conductive structures.

Figure 7:
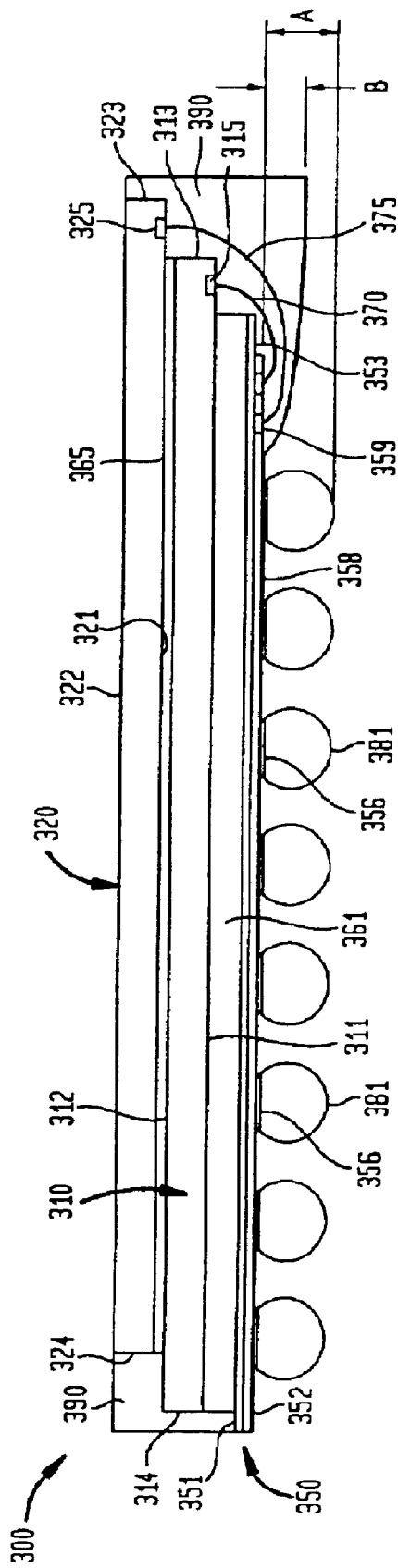
Figure 8:
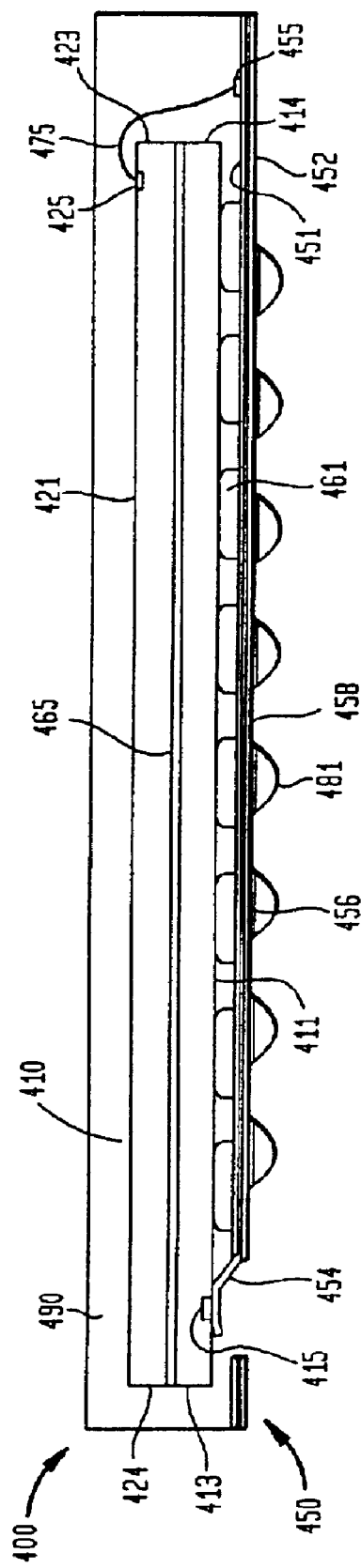

A stacked structure 300 depicted in FIG. 7 comprises a first microelectronic element in the form of a semiconductor chip 310 having contacts 315 and a second microelectronic element in the form of a semiconductor chip 320 having contacts 325. Preferably, microelectronic elements 310 and 320 are substantially identical to one another. Microelectronic element 310 has a face surface 311; a back surface 312 opposite the face surface; a first edge 313 extending between the face and back surfaces and a second edge 314, on the side of the element opposite from edge 313, the second edge also extending between the face and back surfaces. Electrical contacts 315 are exposed on face surface 311, within a first edge region of the face surface adjacent first edge 313. The second microelectronic element has a similar face surface 321 a back surface 322 opposite the face surface; first edge 313 extending between the face and back surfaces; and second edge 314. Here again, the electrical contacts 325 are exposed on an edge region of face surface 321 adjacent the first edge 323 of the second element.

Chip 320 overlies chip 310, which is disposed between chip 320 and dielectric element 350. Face surface 321 of chip 320 faces downward toward dielectric element 350. Face surface 311 of the first chip 310 faces downward toward the dielectric element, so that face surface 321 confronts back surface 312 in a "front-to-back" configuration. The contact-bearing edge region of chip 320 projects beyond the first edge 313 of first chip 310. It is preferred, although not necessary to the invention, that chips 310 and 320 are attached to each other by means such as adhesive layer 365, similar to the adhesive layer 65 of FIG. 1.

Dielectric element 350 is, preferably, of the same single-metal type as has been described for the embodiments of FIG. 1. Element 350 has a first surface 351 and a second surface 352 with electrically conductive terminals 356 exposed on the second surface through a solder mask 358. Bond pads 359 are also exposed on second surface 352 in an edge region adjacent a first edge 353 of dielectric element 350.

The contact-bearing edge regions of chips 310,320 are oriented in a staggered formation, and both of these edge regions extend beyond the first edge 353 of the dielectric element nearest the bond pads. Such arrangements create relatively short distances between the contacts and the nearest bond pads. That is, chips 320 and 310 are oriented so that contacts 315,325 and bond pads 359 are present at the same end of assembly 300. The chips are staggered so that the edge region containing contacts 315 extends beyond edge 353 of dielectric element 350 and the edge region containing contacts 325 extend beyond both the region of contacts 315 and the region of bond pads 359. This results in the second edge 314 of chip 310, which is opposite edge 313, projecting beyond edge 324 of chip 320. Stated another way, the second edge 324 of the second chip 320 does not project beyond chip 310. Contacts 315 and 325 are electrically connected to bond pads 359 by elongated leads 370 and 375, respectively. Preferably, leads 370,375 are wire bonds. This particularly preferred embodiment provides economical bond formation. All of the bonds can be formed in a single wire-bonding setup, without reorienting the assembly. Moreover, the wire bonds do not extend upwardly beyond the second chip 320. Although the wire bonds and the encapsulant covering the wire bonds project downwardly beyond the dielectric layer 350, this does not add to the height of the assembly provided that the height B of the encapsulant is less than or equal to the height A of the joining units 381. In further variants, the same staggered arrangement of chips can be used with other types of bonding as, for example, with ribbon leads projecting from the dielectric layer.

In preferred embodiments, stacked assembly 310 also includes a spacer layer 361 disposed between chip 310 and first surface 351 of dielectric element 350. More preferably, spacer layer 361 is a compliant layer. Such spacer layers have been discussed with respect to the embodiment of FIG. 1.

Assembly 310 may also include an encapsulant 390 that covers elongated leads 370,375. In embodiments that do not include a separate spacer layer 361, the encapsulant may also be provided between chip 310 and first surface 351, and may fill open spaces adjacent chips 310 and 320 and dielectric element 350. Preferred encapsulants are similar to those discussed with respect to the embodiment of FIG. 1.

Preferred combinations of the features described above allow the manufacture of a two-chip stacked assembly such as assembly 300 having a thickness of less than 700 microns above terminals 356.

Figure 9A:
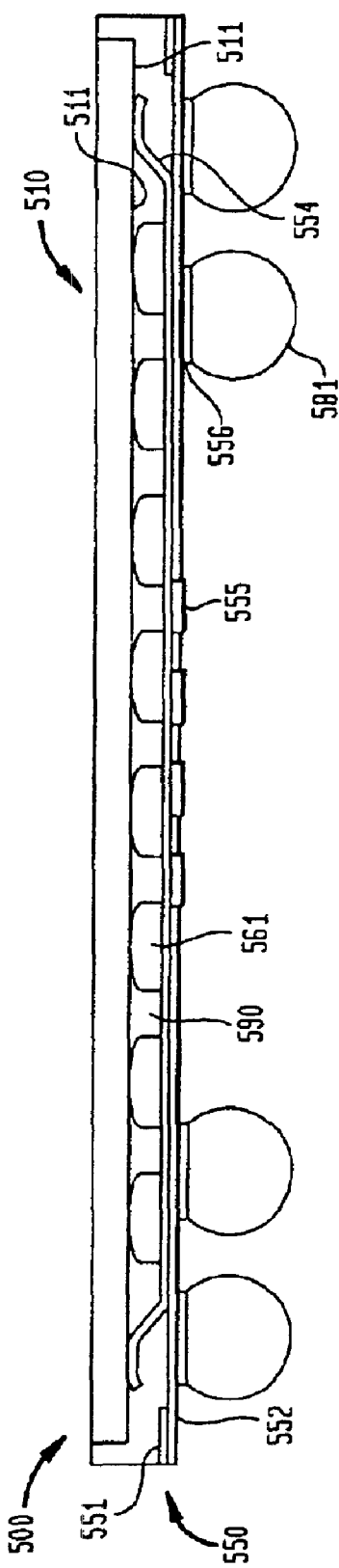
FIGS. 9A and 9B are diagrammatic sectional elevational views of subassemblies used in an assembly according to another embodiment of the present invention.
Figure 9B:
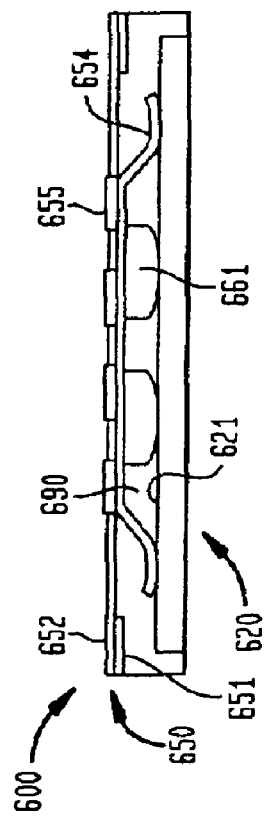

Another preferred embodiment of a stacked assembly having a particularly low height is illustrated in FIG. 9. Preferably, microelectronic elements 410 and 420 are semiconductor chips that are substantially identical to one another. Chip 410 has contacts 415 exposed on a face surface 411, preferably disposed within a region adjacent three, more preferably two, and most preferably one, edges. In the preferred embodiment of FIG. 9, contacts 415 are disposed within a region adjacent first edge 413. Chip 410 also is provided with a second edge 414 opposite edge 413. Chip 420 preferably is substantially similar to chip 410, having contacts 425 exposed on a face surface 411 within a region adjacent a first edge 413, which is opposite a second edge 414. Chip 420 overlies chip 410, which is disposed between chip 420 and dielectric element 450 with face surface 411 confronting dielectric element 450. Chips 410 and 420 preferably are arranged in a "back-to-back" configuration, similar to that discussed for microelectronic elements 10 and 20 of FIG. 1, with face surface 411 confronting dielectric element 450 and face surface 421 facing away from the dielectric element. Preferably, chips 410 and 420 are attached to each other by means such as adhesive layer 465.

Dielectric element 450 is, preferably, of the same single-metal type as has been described for the embodiments of FIG. 1. The dielectric element is provided with conductive features, preferably including bond pads such as bond pads 455 exposed on first surface 451 and terminals 456 exposed on second surface 452 through openings in solder mask 458, the various conductive features being interconnected by traces and bond ribbons formed from the metallic layer.

Contacts 415 preferably are connected to bond ribbons leads 454, which, more preferably, are integral with the traces. Leads 454 may be made by the methods discussed above with regard to leads 154. Contacts 425 preferably are electrically connected to bond pads 455 by wire bonds 475. In preferred embodiments, at least some of the bond pads 455 are movable with respect to contacts 425. Wire bonds may be formed as discussed above.

In the preferred embodiment of FIG. 9, first edge 413 of chip 410 is disposed adjacent to second edge 424 of chip 420 so that contacts 415 and 425, respectively are near opposite ends of assembly 400. Other orientations of edges 413,414 relative to edges 423,424 are also within the scope of the preferred embodiments.

Assembly 400 preferably is provided with a spacer layer disposed between chip 410 and first surface 451 of dielectric element 450, illustrated as a multiplicity of compliant pads or nubbins 481. The assembly is provided, preferably, with encapsulant 490 surrounding the chips and bond wires, as also has been discussed herein. The encapsulant may penetrate between the nubbins to form a compliant spacer layer including both the nubbins and the encapsulant.

As depicted in FIG. 9, the stacked assembly may further include a plurality of joining units connected to terminals 456. Low-height solder balls may be used, as has been discussed with respect to FIG. 1. Solder bumps 481, which are not full spherical balls, also may be used as joining units, typically being from about 110–150 microns in height.

In a further embodiment (FIGS. 10A–10C), the present invention provides stacked microelectronic assemblies comprising a first microelectronic subassembly 500 and a second microelectronic subassembly 600 that are electrically interconnected.

As depicted in FIG. 10A, first microelectronic subassembly 500 comprises a first microelectronic element, such as a semiconductor chip, a plurality of semiconductor chips or a semiconductor wafer. Preferably, microelectronic assembly 510 has a face surface 511 with a plurality of first contacts (not shown) exposed thereon. First subassembly 500 also includes a first dielectric element 550 having a first surface 551 and a second surface 552. Dielectric element 550 may comprise a single-metal or bimetal tape; preferably, a single metal tape as discussed herein. Dielectric element 550 further comprises a plurality of first terminals 556 and first lands 555 exposed on second surface 552. In more preferred embodiments, terminals 556 are disposed in a peripheral region of dielectric element 550 and first lands 555 are disposed in a central region of the dielectric element.

Microelectronic element 510 overlies first surface 551, preferably in a face-down orientation with face surface 511 confronting first surface 551. At least some of the first contacts are electrically connected to at least some of the conductive features on first surface 551. In assembly 500, the connections are made through leads 554, the formation of which is discussed with respect to the embodiment of FIG. 5. The use of other types of leads, such as wire bonds discussed above, are also within the scope of the preferred embodiments related to FIGS. 10–11. Use of ribbon leads such as leads 554 are preferred to minimize the overall thickness of the subassembly.

Preferably, first lands 555 are disposed so as to underlie microelectronic element 510. It is particularly preferred that at least some of terminals 556 are movable with respect to microelectronic element 510, for reasons discussed with respect to the stacked assembly of FIG. 1 and other embodiments of stacked assemblies disclosed herein.

Second microelectronic subassembly 600, depicted in FIG. 10B, comprises a second microelectronic element 620 and a dielectric element 650. Although second subassembly 600, as depicted, may be of similar construction to first subassembly 500, its preferred embodiments will be restricted to those having a particularly small thickness and areal extent substantially less than that of first subassembly 500. These restrictions are preferred so that subassembly 600 may fit within the terminal array of first subassembly 500 while minimizing the size of the joining units required to make an effective stacked assembly as illustrated in 10C.

Microelectronic element 620 preferably is a semiconductor chip having a face surface 611 with a plurality of second contacts (not shown) exposed thereon. Second subassembly 600 also includes a second dielectric element 650 having a first surface 651 and a second surface 652. Dielectric element 650 may comprise a single-metal or bimetal tape; preferably, a single metal tape as discussed herein. Dielectric element 650 further comprises a plurality of second lands 655 exposed on second surface 652. As will be obvious to those skilled in the art, the presence of terminals on the second subassembly is not necessary to the invention. The lands 655 desirably are movable with respect to element 620.

Microelectronic element 620 overlies first surface 651, preferably in a face-down orientation with face surface 611 confronting first surface 651. At least some of the second contacts are electrically connected to at least some of the conductive features on first surface 651. Electrical connections between the second contacts and the dielectric element may be made by any suitable means disclosed herein.

Preferably, second lands 655 are disposed so as to underlie microelectronic element 620. It is particularly preferred that at least some of lands 655 are movable with respect to microelectronic element 620.

As with other stacked assemblies disclosed herein, microelectronic subassemblies 500 and 600 preferably are provided with spacer layers 561,661 between microelectronic elements 510,610 and the respective first surfaces 551,651. The spacer layers may be compliant layers, in the form of a single pad or a plurality of pads or nubbins 561,661. Subassemblies 500 and 600 may also be provided with an encapsulant 590,690 surrounding the element and leads. Preferred materials and implementation of spacer layers and encapsulants have been discussed with respect to the embodiments of other stacked assemblies disclosed herein. The encapsulants 590,690 may be of the same materials as each other, or different materials may be used. Similarly, the spacer layers 561,661 may be of the same or different materials or construction, depending on the specific requirements of a selected embodiment.

First assembly 500 and second assembly 600 are electrically interconnected to form a stacked microelectronic assembly, such as that depicted in FIG. 10C, with second surface 552 and second surface 652 confronting each other. At least some of first lands 555 are electrically connected to at least some of and second lands 655, thereby providing electrical interconnections between the subassemblies. Preferably, the first lands overlie the second lands and are joined thereto. Any suitable method may be used to join the respective lands one to another or to provide the electrical connections. The preferred method of doing so is to solder-bond the first lands to their respective second lands. The individual subassemblies may be tested prior to joining the subassemblies, as by engaging the terminals and/or lands with a test fixture prior to joining the assemblies with one another.

The stacked assembly of subassemblies 500,600 may further include a plurality of joining units, such as solder balls 581, which are connected to terminals 556 of first subassembly 500 and electrically interconnected, directly or indirectly, to first lands 555. The joining units must be sufficiently large so that they project from terminals 556 on second surface 552 beyond second assembly 600. That is to say, the height A of the joining units must be greater than the distance B from second surface 552 to the surface of second subassembly 600 that is furthest from surface 552. It is therefore beneficial to provide a second subassembly having the smallest thickness compatible with the intended purpose of the stacked assembly to minimize the necessary height of the joining units and, thus, the overall height of the assembly. Preferably, the elements of subassemblies 500 and 600 are selected to produce a stacked assembly having an overall thickness of about 1 mm or less, more preferably, about 700 microns or less, excluding the height of any joining units.

Although FIG. 9C depicts a particularly preferred embodiment wherein the centers of the first and second assemblies are aligned, the present invention also includes embodiments where the first assembly overlies some or all of the second assembly but the centers of such assemblies are not aligned. It is preferred that the second subassembly fit within the planar area of the first assembly. More particularly, it is preferred that the second subassembly fit within the array of terminals on first surface 552.

Figure 10:
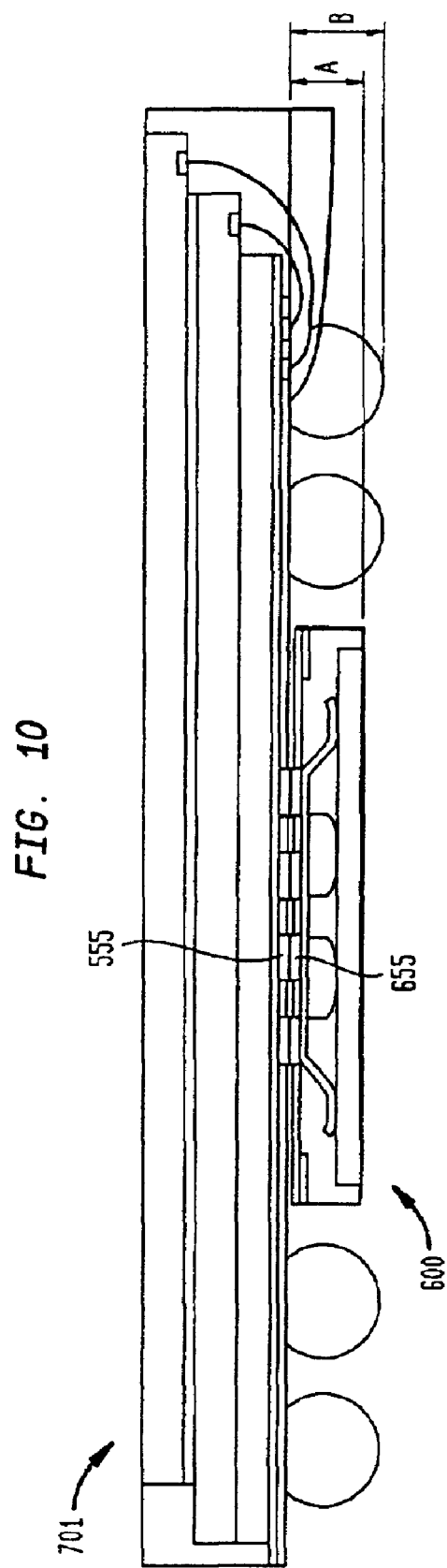
FIG. 10 is a view similar to FIG. 10C but depicting another embodiment of the present invention.

As depicted in FIG. 10, the first subassembly may comprise microelectronic elements of other types than that depicted as subassembly 500. As an example, FIG. 10 illustrates a stacked package wherein the first subassembly 701 is of the same general type as the stacked assembly 300 discussed above with reference to FIG. 7. Also, any suitable microelectronic element may be substituted for first element 510 as long as first lands 555 and other suitable conductive features and connections are provided with dielectric element 550. Other microelectronic elements may be used in place of second element 620 consistent with the limitations of thickness and planar area discussed herein.

As these and other variations and combinations of the features discussed above can be utilized without departing from the present invention as defined by the claims, the foregoing description of the preferred embodiments should be taken by way of illustration rather than by way of limitation of the claimed invention.

What is claimed is:

1. A microelectronic assembly comprising:
   (a) a dielectric element having an upwardly-facing first surface and a downwardly-facing second surface and having terminals exposed at said second surface;
   (b) a first microelectronic element overlying said first surface of said dielectric element; and
   (c) a second microelectronic element overlying said first microelectronic element,
   said first and second microelectronic elements being electrically connected with said terminals, said terminals being movable with respect to said first microelectronic element, said assembly having a thickness above said terminals of less than 1.2 mm.

2. An assembly as claimed in claim 1 wherein at least some of said terminals are disposed on a region of said dielectric element beneath said first microelectronic element.

3. An assembly as claimed in claim 2 further comprising joining units bonded to at least some of said terminals, said joining units having a height of about 300 microns or less.

4. An assembly as claimed in claim 3 wherein said height of said joining units is about 150 microns or less.

5. An assembly as claimed in claim 4, wherein said thickness is less than 1 mm.

6. An assembly as claimed in claim 5 wherein said thickness is less than 0.7 mm.

7. An assembly as claimed in claim 3 wherein said joining units include solder balls.

8. An assembly as claimed in claim 7 further comprising a substrate having contact pads, at least some of said terminals being connected to said contact pads by said joining units.

9. A microelectronic assembly, comprising:
   (a) a dielectric element having a first surface, a second surface opposite the first surface and a plurality of electrically conductive terminals exposed on said second surface;
   (b) a first microelectronic element having a face surface, a back surface, and a plurality of first contacts exposed on the face surface, wherein said first microelectronic element is disposed over the dielectric element so that the face surface faces toward said dielectric element;
   (c) a plurality of first elongated leads, at least some of the first contacts being electrically connected with at least some of the terminals on said dielectric element through said first elongated leads;
   (d) a second microelectronic element having a top surface, a bottom surface, and a plurality of second contacts exposed on the top surface, said second microelectronic element being disposed over the first microelectronic element so that the top surface faces away from the dielectric element, and the bottom surface of the second microelectronic element confronts the back surface of the first microelectronic element; and
   (e) a plurality of second elongated leads, at least some of the second contacts being electrically connected with at least some of the terminals on said dielectric element through said second elongated leads,
   wherein at least some of the terminals are movable with respect to the first contacts.

10. An assembly as claimed in claim 9 wherein said first microelectronic element is disposed between said second microelectronic element and said first surface of said dielectric element.

11. An assembly as claimed in claim 10, wherein at least some of the terminals are movable with respect to the second contacts.

12. An assembly as claimed in claim 11, further comprising a compliant layer disposed between the surface of the dielectric element and the face surface of the first microelectronic element.

13. An assembly as claimed in claim 12, further comprising an adhesive disposed between the back surface of the first microelectronic element and the bottom surface of the second microelectronic element.

14. An assembly as claimed in claim 13, wherein said adhesive includes a compliant material.

15. An assembly as claimed in claim 14, further comprising an encapsulant disposed over the second leads.

16. An assembly as claimed in claim 15, wherein said encapsulant is further disposed over the top surface of the second microelectronic element.

17. An assembly as claimed in claim 16, wherein said encapsulant is comprised of a high modulus material.

18. An assembly as claimed in claim 17, wherein said encapsulant is comprised of an epoxy.

19. An assembly as claimed in claim 9, wherein said dielectric element is flexible.

20. An assembly as claimed in claim 19, wherein said dielectric element is comprised of polyimide.

21. An assembly as claimed in claim 10, wherein at least one of the terminals which is movable with respect to one of the first contacts underlies said first microelectronic element.

22. An assembly as claimed in claim 10, wherein at least some of said first leads are bond ribbons.

23. An assembly as claimed in claim 22, wherein each of said bond ribbons is curved.

24. An assembly as claimed in claim 22, wherein said dielectric element has at least one aperture extending between said first and second surfaces and bond pads disposed on said second surface, said leads and bond pads being integrally formed with said bond ribbons, and said first leads extend from said first contacts through said aperture.

25. An assembly as claimed in claim 22, wherein at least some of said second leads are wire bonds.

26. An assembly as claimed in claim 10, wherein at least some of said first leads are wire bonds.

27. An assembly as claimed in claim 26, wherein said dielectric element has at least one aperture extending between said first and second surfaces and bond pads disposed on said second surface, and said first leads extend from said first contacts through said aperture to said bond pads.

28. An assembly as claimed in claim 9, further comprising
(f) a third microelectronic element disposed over the second microelectronic element, said third microelectronic element having a top surface facing away from the first surface of the dielectric element and a bottom surface facing toward the top surface of the second microelectronic element, and a plurality of third contacts exposed on the top surface of the third microelectronic element; and
(g) a plurality of third elongated leads electrically connecting at least some of the third contacts with some of the terminals.

29. An assembly as claimed in claim 28, wherein at least some of said third leads are wire bonds.

30. An assembly as claimed in claim 9, wherein said first and second microelectronic elements are semiconductor chips.

31. An assembly as claimed in claim 9, wherein said first microelectronic element is comprised of two semiconductor chips which are disposed side by side and said second microelectronic element is disposed over both said chips.

32. An assembly as claimed in claim 10, further comprising an additional microelectronic element disposed on the second surface of the dielectric element, said additional microelectronic element underlying at least a portion of the first microelectronic element.

33. A microelectronic assembly comprising:
(a) first and second microelectronic elements, each said microelectronic element having a face surface, a back surface and opposite first and second edges extending between the face and back surfaces of such element, said second microelectronic element overlying said first microelectronic element with the face surface of the second microelectronic element confronting a surface of the first microelectronic element, said microelectronic elements being staggered so that a first edge region of the second microelectronic element face surface adjacent the first edge of the second microelectronic element projects in beyond the first microelectronic element and so that the second edge of the second microelectronic element does not project beyond the first microelectronic element, said second microelectronic element having contacts exposed on said face surface of said second microelectronic element within said first edge region, said first microelectronic element having contacts exposed on its face surface;
(b) a dielectric element having first and second surfaces, said first and second microelectronic elements being disposed over said first surface of said dielectric element with said first microelectronic element between said dielectric element and said second microelectronic element;
(c) electrically conductive features on said dielectric element; and
(d) leads extending between at least some of said contacts of each said microelectronic element and at least some of said conductive features on said dielectric element.

34. An assembly as claimed in claim 33 wherein said conductive features include terminals exposed on said second surface of said dielectric element.

35. An assembly as claimed in claim 33 wherein said face surface of said second microelectronic element confronts said rear surface of said first microelectronic element.

36. An assembly as claimed in claim 35 wherein said contacts of said first microelectronic element are disposed in a first edge region of the face surface of the first microelectronic element adjacent the first edge thereof, and where said first edge region of said second microelectronic element projects beyond said first edge of said first microelectronic element.

37. An assembly as claimed in claim 36 wherein said dielectric element has a first edge and said first edge regions of said first and second microelectronic elements project beyond said first edge of said dielectric element, and wherein said leads extend around said first edge of said dielectric element.

38. An assembly as claimed in claim 37 wherein said conductive features include bond pads exposed on said second surface of said dielectric element adjacent said first edge of said dielectric element, and wherein said leads include wire bonds extending between said contacts of said microelectronic elements and said bond pads.

39. An assembly as claimed in claim 37 wherein said first and second microelectronic elements are substantially identical to one another.

40. An assembly as claimed in claim 38 wherein said conductive features include only a single layer of metallization.

41. An assembly as claimed in claim 33 further comprising a substrate having contact pads, and joining elements connecting at least some of said terminals to said contact pads.

42. A microelectronic assembly including:
(a) a dielectric element having first and second surfaces;
(b) conductive features on said dielectric element including elongated traces, terminals connected to said traces, bond ribbons formed integrally with at least some of said traces, and bond pads formed integrally with others of said traces, said terminals being exposed on said second surface of said dielectric element;
(c) first and second microelectronic elements, each said microelectronic element having a face surface, a back surface and contacts exposed on the face surface of the microelectronic element, said first microelectronic element overlying the first surface of the dielectric element with the face surface of the first microelectronic element facing downwardly toward the first surface of the dielectric element and with the back surface of the first microelectronic element facing upwardly away from the dielectric element, the second microelectronic element overlying the first microelectronic element;
(d) wire bonds connecting the contacts of the second microelectronic element with said bond pads, said bond ribbons extending to the contacts of the first microelectronic element.

43. An assembly as claimed in claim 42 wherein said face surface of said second microelectronic element faces upwardly away from said dielectric element.

44. An assembly as claimed in claim 43 wherein each said microelectronic element has opposite first and second edges extending between its face and back surfaces, and wherein said contacts of each said microelectronic element are disposed in an edge region adjacent the first edge of that microelectronic element, said first edge of said second microelectronic element being disposed adjacent the second edge of said first microelectronic element.

45. An assembly as claimed in claim 44 wherein said first and second microelectronic elements are substantially identical to one another.

46. An assembly as claimed in claim 42 wherein said conductive features include only a single layer of metallization.

47. An assembly as claimed in claim 42 further comprising a substrate having contact pads, at least some of said terminals being connected to said contact pads by said joining units.

48. A stacked microelectronic assembly, comprising:
   a) a first subassembly comprising;
      i) a first microelectronic element;
      ii) a first dielectric element having first and second surfaces and conductive features on said first dielectric element including a plurality of first terminals and first lands, said first terminals and first lands being exposed on said second surface, said first microelectronic element overlying said first surface of said first dielectric element and being electrically connected with at least some of said conductive features on said first dielectric element;
   b) a second subassembly comprising;
      iii) a second microelectronic element; and
      iv) a second dielectric element having first and second surfaces and conductive features on said second dielectric element including second lands exposed on said second surface of said second dielectric element, wherein the second surface of the first dielectric element and the second surface of the second dielectric element confront each other and said first lands overlie said second lands and are electrically connected thereto; and
   c) joining units connected to at least some of said terminals of said first subassembly and projecting from said second surface of said first dielectric element beyond said second subassembly.

49. An assembly as claimed in claim 48 wherein said terminals are disposed in a peripheral region of said first dielectric element and said first lands are disposed in a central region of said first dielectric element.

50. An assembly as claimed in claim 48 wherein at least some of said first lands underlie the first microelectronic element.

51. An assembly as claimed in claim 48, wherein said first and second lands are solder-bonded to one another.

52. An assembly as claimed in claim 48, wherein said terminals are movable with respect to said first microelectronic element.

53. An assembly as claimed in claim 48, wherein said second lands are movable with respect to said second microelectronic element.

54. An assembly as claimed in claim 48, wherein said conductive features on said second dielectric element include traces extending from at least some of said lands along said second dielectric element and bond ribbons formed integrally with said traces, said bond ribbons being connected with said second microelectronic element.

55. An assembly as claimed in claim 48, wherein, said first microelectronic subassembly comprising a third microelectronic element overlying said first microelectronic element and being electrically connected with said at least some of said conductive features on said first dielectric element.

56. An assembly as claimed in claim 55, at least one of said conductive features on said first dielectric element being movable with respect to at least said first microelectronic element.

57. An assembly as claimed in claim 48, wherein said first microelectronic element comprises a face surface, a back surface, and a plurality of first contacts exposed on the face surface and is disposed over said first dielectric element with said face surface confronting said first dielectric element, said first microelectronic subassembly comprising a plurality of first elongated leads, electrically connecting at least some of the first contacts with at least some of said conductive features on said first dielectric element;

a third microelectronic element having a top surface, a bottom surface, and a plurality of second contacts exposed on the top surface, said third microelectronic element being disposed over the first microelectronic element so that the top surface faces away from the first dielectric element and the bottom surface confronts the back surface of the first microelectronic element; and a plurality of second elongated leads, at least some of the second contacts being electrically connected with at least some of said conductive features on said first dielectric element through said second elongated leads.

58. An assembly as claimed in claim 57, at least one of said conductive features on said first dielectric element being disposed beneath said face surface of said first microelectronic element and movable with respect to at least one of said first contacts.

59. An assembly as claimed in claim 48, wherein said first microelectronic element comprises first and second semiconductor chips, each said semiconductor chip having a face surface, a back surface and first and second edges extending between the face and back surfaces, said second semiconductor chip overlying said first semiconductor chip with the face surface of the second chip confronting a surface of the first chip with the first edges of said first chips disposed adjacent the first edge of said second chip, said chips being staggered so that an edge region of the second chip face surface adjacent the first edge of the second chip projects in a first lateral direction beyond the first edge of the first chip and so that the second edge of the second chip does not project beyond the second edge of the first chip, said second chip having contacts exposed on said face surface of said second chip within said first edge region, said first chip having contacts exposed on its face surface, said first and second chips being disposed over said first surface of said first dielectric element with said first chip between said first dielectric element and said second chip; and leads extending between at least some contacts of each said chip and said at least some of said conductive features on said first dielectric element.

60. An assembly as claimed in claim 59, wherein said conductive features on said first dielectric element include elongated traces, at least some of said first terminals being electrically connected with said traces, bond ribbons formed integrally with at least some of said traces, and bond pads formed integrally with others of said traces, said first microelectronic element comprising first and second semiconductor chips, each said semiconductor chip having a face surface, a back surface and contacts exposed on the face surface of the chip, said first chip overlying the first dielectric element with the face surface of the first chip confronting the first surface of the first dielectric element and with the back surface of the first chip facing upwardly away from the first dielectric element, the second chip overlying the first chip; and wire bonds connecting the contacts of the second chip with said bond pads, said bond ribbons extending to the contacts of the first chip.

* * * * *

Disclaimer

6,885,106 B1—Philip Damberg, Cupertino, CA (US); Craig S. Mitchell, San Jose, CA (US); John B. Riley, Dallas, TX (US); Michael Warner, San Jose, CA (US); Joseph Fjelstad, Maple Valley, WA (US). STACKED MICROELECTRONIC ASSEMBLIES AND METHODS OF MAKING SAME. Patent dated April 26, 2005. Disclaimer filed January 29, 2013, by the inventors.

Hereby disclaim complete claims 1-60 of said patent; and reexamination claims 61-55 of Control No. 95/001,664.

*(Official Gazette, July 30, 2013)*

(12) INTER PARTES REEXAMINATION CERTIFICATE (683rd)
United States Patent
Damberg et al.

(10) Number: US 6,885,106 C1
(45) Certificate Issued: Sep. 3, 2013

(54) STACKED MICROELECTRONIC ASSEMBLIES AND METHODS OF MAKING SAME

(75) Inventors: Philip Damberg, Cupertino, CA (US);
Craig S. Mitchell, San Jose, CA (US);
John B. Riley, Dallas, TX (US);
Michael Warner, San Jose, CA (US);
Joseph Fjelstad, Maple Valley, WA (US)

(73) Assignee: Tessera, Inc., San Jose, CA (US)

Reexamination Request:
No. 95/001,664, Jun. 17, 2011

Reexamination Certificate for:
Patent No.: 6,885,106
Issued: Apr. 26, 2005
Appl. No.: 10/044,121
Filed: Jan. 11, 2002

Disclaimer of claims 1-60
Filed: Jan. 29, 2013 (1392 OG 256)

Related U.S. Application Data

(60) Provisional application No. 60/261,059, filed on Jan. 11, 2001.

(51) Int. Cl.
*H01L 23/31* (2006.01)
*H01L 23/49* (2006.01)
*H01L 25/065* (2006.01)
*H01L 23/28* (2006.01)
*H01L 23/48* (2006.01)

(52) U.S. Cl.
USPC .............. 257/777; 257/58; 257/67; 257/68; 257/686; 257/697; 257/E23.024; 257/E25.013

(58) Field of Classification Search
None
See application file for complete search history.

(56) References Cited

To view the complete listing of prior art documents cited during the proceeding for Reexamination Control Number 95/001,664, please refer to the USPTO's public Patent Application Information Retrieval (PAIR) system under the Display References tab.

*Primary Examiner* — Erik Kielin

(57) ABSTRACT

A stacked microelectronic assembly includes a dielectric element and a first and second microelectronic element stacked one atop the other with the first microelectronic element disposed between the second microelectronic element and the dielectric. The dielectric element has opposed first and second surfaces with conductive features exposed at the first surface and terminals exposed on the second surface. Preferably, the contact-bearing face of the first microelectronic element confronts the first surface of the dielectric with at least some of the conductive features being movable with respect to the contacts or terminals. By providing such movable features, joining units have heights of about 300 microns or less may be joined to the terminals thereby reducing the overall height of the microelectronic assembly to 1.2 mm and less.

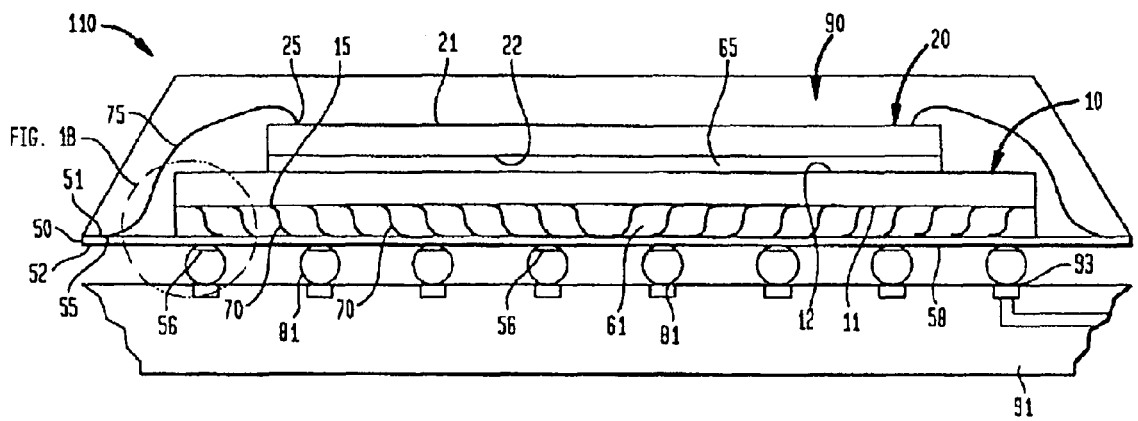

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

Claims 1-60 are now disclaimed.

\* \* \* \* \*